(12) United States Patent
Kondo et al.

(10) Patent No.: US 6,169,678 B1
(45) Date of Patent: Jan. 2, 2001

(54) PHOTOVOLTAIC POWER GENERATION APPARATUS AND CONTROL METHOD THEREOF

(75) Inventors: Hiroshi Kondo, Nara; Naoki Manabe; Nobuyoshi Takehara, both of Kyoto-fu, all of (JP)

(73) Assignee: Canon Kabushiki Kaisha, Tokyo (JP)

( * ) Notice: Under 35 U.S.C. 154(b), the term of this patent shall be extended for 0 days.

(21) Appl. No.: 09/491,870

(22) Filed: Jan. 27, 2000

(30) Foreign Application Priority Data

Jan. 28, 1999 (JP) .................................................. 11-019342
Jan. 20, 2000 (JP) .................................................. 12-011857

(51) Int. Cl.[7] ...................................................... H02J 7/10
(52) U.S. Cl. .............................................. 363/71; 323/906
(58) Field of Search .................................. 363/50, 51, 71, 363/78, 79; 323/906; 307/45, 46, 64, 66

(56) References Cited

U.S. PATENT DOCUMENTS

| | | | |
|---|---|---|---|
| 4,725,740 | * | 2/1988 | Nakata ................................... 307/64 |
| 5,493,155 | * | 2/1996 | Okamoto et al. ....................... 307/45 |
| 5,493,485 | * | 2/1996 | Okado ..................................... 363/56 |
| 5,654,883 | * | 8/1997 | Takehara et al. ....................... 363/79 |
| 5,659,465 | * | 8/1997 | Flack et al. ............................. 363/71 |
| 5,684,385 | * | 11/1997 | Guyonneau et al. .................. 307/46 |
| 5,719,758 | * | 2/1998 | Nakata et al. .......................... 363/98 |

* cited by examiner

*Primary Examiner*—Adolf Deneke Berhane
(74) *Attorney, Agent, or Firm*—Fitzpatrick, Cella, Harper & Scinto

(57) ABSTRACT

A photovoltaic power generation apparatus having a plurality of power converters, respectively connected to a plurality of solar battery arrays, for converting direct-current power generated by the solar battery arrays to alternating-current power so as to provide the alternating-current power to a commercial power system. The photovoltaic power generation apparatus is so constructed that the plurality of power converters do not simultaneously suspend operation when an abnormal state is detected, in order to prevent generation of an electrical stress or reduction of the power generation amount caused by simultaneous operation suspension of the power converters or repeated operation suspension and operation resume. When the power generation amount of each solar battery array is different, a power converter connected to the solar battery array of the smallest power generation amount is set in the first-to-suspend condition.

12 Claims, 10 Drawing Sheets

| SWITCH SETTING POSITION | 1 | 2 | 3 | 4 | 5 | 6 | 7 | 8 |
|---|---|---|---|---|---|---|---|---|
| SET VALUE (V) | 105 | 107.5 | 110 | 112.5 | 115 | 117.5 | 120 | 122.5 |

| SWITCH SETTING POSITION | 1 | 2 | 3 | 4 | 5 | 6 | 7 | 8 |
|---|---|---|---|---|---|---|---|---|
| SET VALUE (S) | 0.6 | 0.8 | 1.0 | 1.2 | 1.4 | 1.6 | 1.8 | 2.0 |

POWER RECEPTION (VR < VS)

BACKWARD CURRENT FLOW (VR > VS)

PHOTOVOLTAIC POWER GENERATION APPARATUS AND CONTROL METHOD THEREOF

BACKGROUND OF THE INVENTION

The present invention relates to a photovoltaic power generation apparatus and to a control method thereof. More particularly, the present invention relates to a photovoltaic power generation apparatus having a plurality of solar battery arrays and a plurality of power converters and to a control method thereof.

Recently, the warming of the earth, caused by carbon dioxide emission involved in the use of fossil fuels, and radioactive contamination caused by accidents in nuclear power plants and radioactive waste have become social issues. Such issues regarding the global environment and energy are rapidly gaining the interest of many people. Photovoltaic power generation, which employs solar rays, an inexhaustible clean energy source, is regarded by the world to be the energy source of tomorrow.

There are various sizes of photovoltaic power generation apparatuses employing solar batteries, and the electric power generated by a given apparatus ranges from several watts to several thousand kilowatts. For general residences, a photovoltaic power generation apparatus, comprising solar batteries of 3 to 5 kW and power converters of 3 to 5 kW, is generally employed. For apartment houses or public buildings or the like where solar batteries can be installed in a wider area than general residences, a photovoltaic power generation apparatus comprising solar batteries of about 10 kW and power converters of about 10 kW, or a photovoltaic power generation apparatus comprising solar batteries of about 10 kW and two or three power converters of 3 to 5 kW connected in parallel are employed.

FIG. 2 shows a photovoltaic power generation apparatus constructed by connecting three units, each comprising a 3.3 kW solar battery and a 3.5 kW power converter, in parallel. In FIG. 2, reference numeral 31 denotes a 3.3 kW solar battery array; 32, a 3.5 kW power converter connected to the solar battery array 31; 33, a switchboard connected to the power converter 32; 34, a transaction power meter box connected to the switchboard 33; and 35, a commercial power system connected to the transaction power meter box 34. Note herein that the 3.5 kW power converter 32 is of the type used for general residences.

The control circuit of the power converter 32 serves to protect the power converter 32 by detecting an abnormal voltage of the commercial power system 35. The protection operation is described hereinafter. When an abnormal voltage of the commercial power system 35 is detected once or a number of times, alternating-current power output of the power converter 32 is suspended and a stand-by mode begins (hereinafter referred to as "operation suspension"). When an abnormal voltage is no longer detected and a predetermined time period lapses, the alternating-current power output of the power converter 32 is automatically resumed (hereinafter referred to as "operation resume").

Needless to say, an abnormal voltage of the commercial power system 35 not only imposes small-scale problems, but also can have large effects on the entire society. For this reason, the frequency and voltage of the commercial power system 35 must be controlled to maintain predetermined values.

Connecting the commercial power system 35 with the power converter 32 requires a distribution line. Since the distribution line has an impedance, a voltage drop is unavoidable at the time of power transmission/reception. For instance, in the system shown in FIG. 9A, the distribution line between the commercial power system 5 and user 6 has an impedance 7. Because of this, the voltage VR at the user 6 at the power receiving end (e.g., voltage at the switchboard 33 in FIG. 2) falls below the system voltage VS of the commercial power system 5. Therefore, the system voltage VS of the commercial power system 5 is set slightly high, taking into account the voltage drop caused by the impedance 7. For instance, the low-voltage output of a pole transformer is set to 105V. Thus, when no load is applied, the voltage VR at the user 6 at the power receiving end is 105V.

On the other hand, when a current flows backward from the photovoltaic power generation apparatus to commercial power system 5 as shown in FIG. 9B, the voltage VR at the user 6 at the power receiving end exceeds 105V because of the influence of the impedance 7. For instance, while the user 6 is receiving power from the commercial power system 5 and consuming 30A, assume that the voltage drops by 4V and the voltage VR at the power receiving end falls to 101V. In this case, in order to send 30A back from the user 6 to the commercial power system 5, the voltage drop needs to be compensated. Thus, the voltage VR at the power receiving end becomes 109V. As described above, because of the influence of the impedance 7 of a distribution line, when the backward current becomes large, the voltage at the user 6 at the power receiving end (voltage at the switchboard 33 or the connection point of the power converter 32 in FIG. 2) becomes high.

In order to maintain a certain voltage for all users, the commercial power system 5 turns on/off switches of a power generating station and substation in correspondence with varying electric power demands. Therefore, the voltage of the commercial power system 5 is not constant, but is changing every moment. FIG. 10 shows an actual measurement result of voltage of the commercial power system 5, measured for a day by the inventors of the present invention. At the points indicated by the arrows A, the system voltage VS reaches about 107V. This means that the voltage at the connection point of the power converter 32 rises or falls according to the level of backward current flow and also according to changes in the level of voltage of the commercial power system 5.

Along these lines the apparatus shown in FIG. 2 is used wherein where three power converters 32, which suspend operation by detecting an abnormal voltage and resume operation automatically when no abnormal voltage is detected, are connected in parallel. When an abnormal state such as a rise in the system voltage VS is detected, the three power converters 32 detect the abnormal voltage and stop operation at the same time. Even after recovery, operation suspension and operation resume may repeatedly occur. This is disadvantageous not only because an electric stress is imposed on a part of the photovoltaic power generation apparatus, but also because the amount of power generated by the photovoltaic power generation apparatus is reduced.

SUMMARY OF THE INVENTION

The present invention solves the above-described problems, and has as its object to prevent generation of an electrical stress or reduction of the power generation amount in a photovoltaic power generation apparatus, caused by plural power converters which detect an abnormal state and simultaneously suspend operation or repeat operation suspension and operation resume.

Another objet of the present invention is to provide a photovoltaic power generation apparatus capable of suspending operation of only a part of power converters when an abnormal state is detected.

In order to achieve the above objects, the present invention provides a photovoltaic power generation apparatus comprising: plural solar battery arrays, each of which is constructed by plural solar battery modules; and plural power converters, each of which is connected to one of the plural solar battery arrays, for converting direct-current power generated by the plural solar battery arrays to alternating-current power so as to provide the alternating-current power to a commercial power system, wherein each of the plural power converters comprises a detector for detecting an abnormal state of output of the alternating-current power of each of the power converters to suspend power conversion operation of each of the power converters, and operation suspension timing of at least one of the plural power converters is earlier than the others.

Furthermore, the present invention provides a controlling method of a photovoltaic power generation apparatus having: plural solar battery arrays, each of which is constructed by plural solar battery modules; and plural power converters, each of which is connected to one of said plural solar battery arrays, for converting direct-current power generated by the plural solar battery arrays to alternating-current power so as to provide the alternating-current power to a commercial power system, said method comprising the steps of: detecting an abnormal state of output of the alternating-current power of each of the power converters; and suspending power conversion operation of each of the power converters when the abnormal state is detected, wherein operation suspension timing of at least one of the plural power converters is earlier than the other.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention, and together with the description, serve to explain the principles of the invention.

DETAILED DESCRIPTION OF THE PREFERRED EMBODIMENTS

Preferred embodiments of the present invention will be described in detail in accordance with the accompanying drawings.

According to preferred embodiments of the present invention, each power converter comprises abnormality detection means for detecting an abnormal state which is described below, so as to stop operation when the abnormality detection means detects an abnormal state. The abnormality detection means of each power converter determines an abnormal state when the duration of an abnormal voltage state reaches a predetermined time. By setting different durations of abnormality detection for each power converter, it is possible to prevent simultaneous operation suspension of a plurality of power converters.

Furthermore, the abnormality detection means of each power converter determines an abnormal state when a level of certain detection value exceeds a predetermined value. Therefore, by setting different abnormality determination values for each abnormality detection means of the power converter, it is possible to prevent simultaneous operation suspension of a plurality of power converters.

As an example of the aforementioned abnormal state, a voltage rise of a commercial power system may be considered. Further, it is preferable that the power generation amount of each solar battery array be different. Still further, it is preferable that a power converter, connected to a solar battery array having the smallest power generation amount, be set in a condition such that operation is suspended first (hereinafter referred to as a first-to-suspend condition) than other power converters connected to a solar battery array having the larger power generation amount.

Furthermore, abnormal voltage detection is normally performed at the alternating-current (AC) power output end of the power converter. However, in the following description, the abnormal voltage detection is performed by the voltage VR at the power receiving end, assuming that a voltage drop generated between the aforementioned output end and the power receiving end (e.g., voltage at a switchboard 3 in FIG. 1) is small.

Construction

Figure 1:
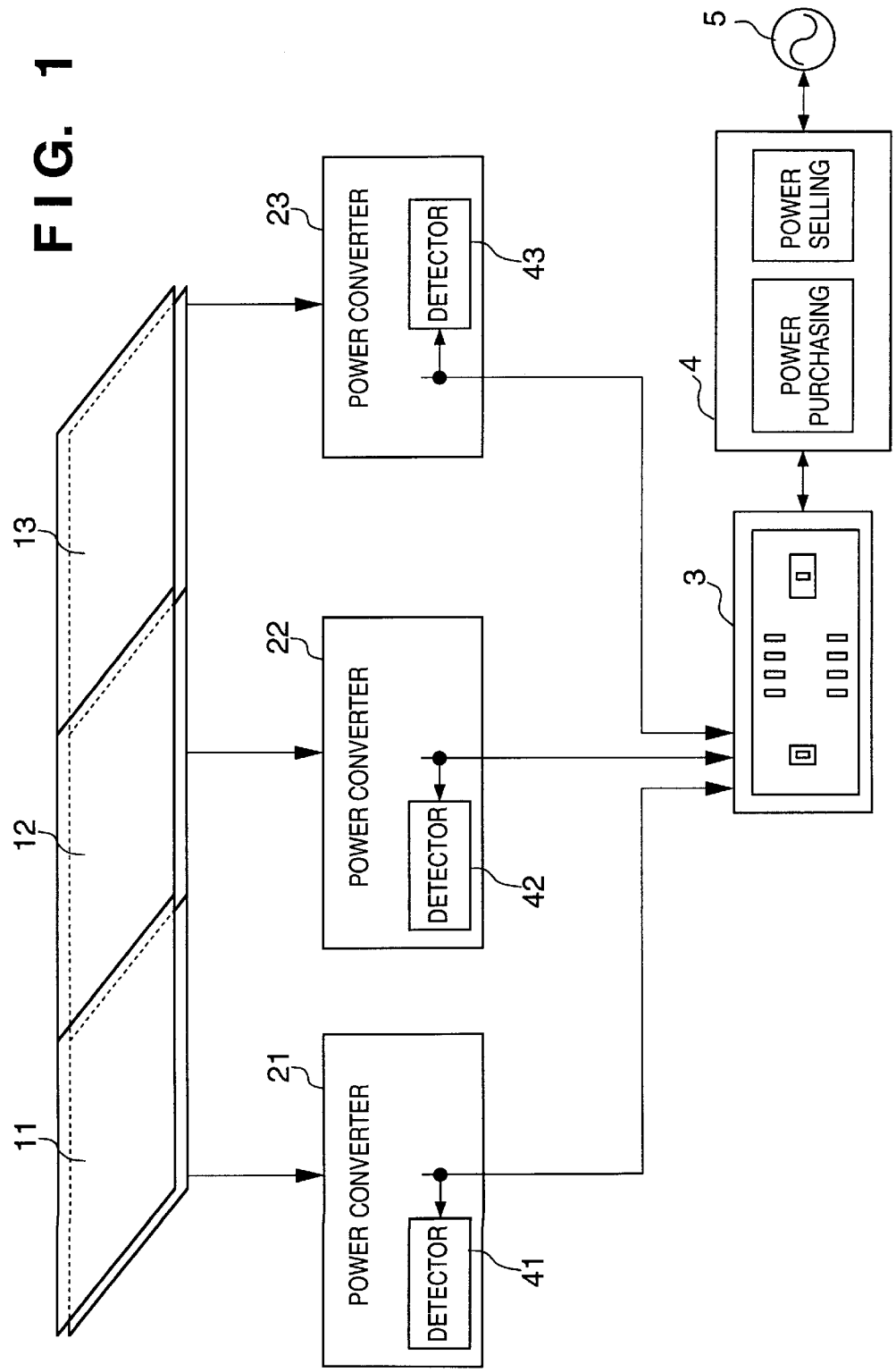
FIG. 1 is a view showing a construction of a photovoltaic power generation apparatus according to the first embodiment of the present invention.
Figure 2:
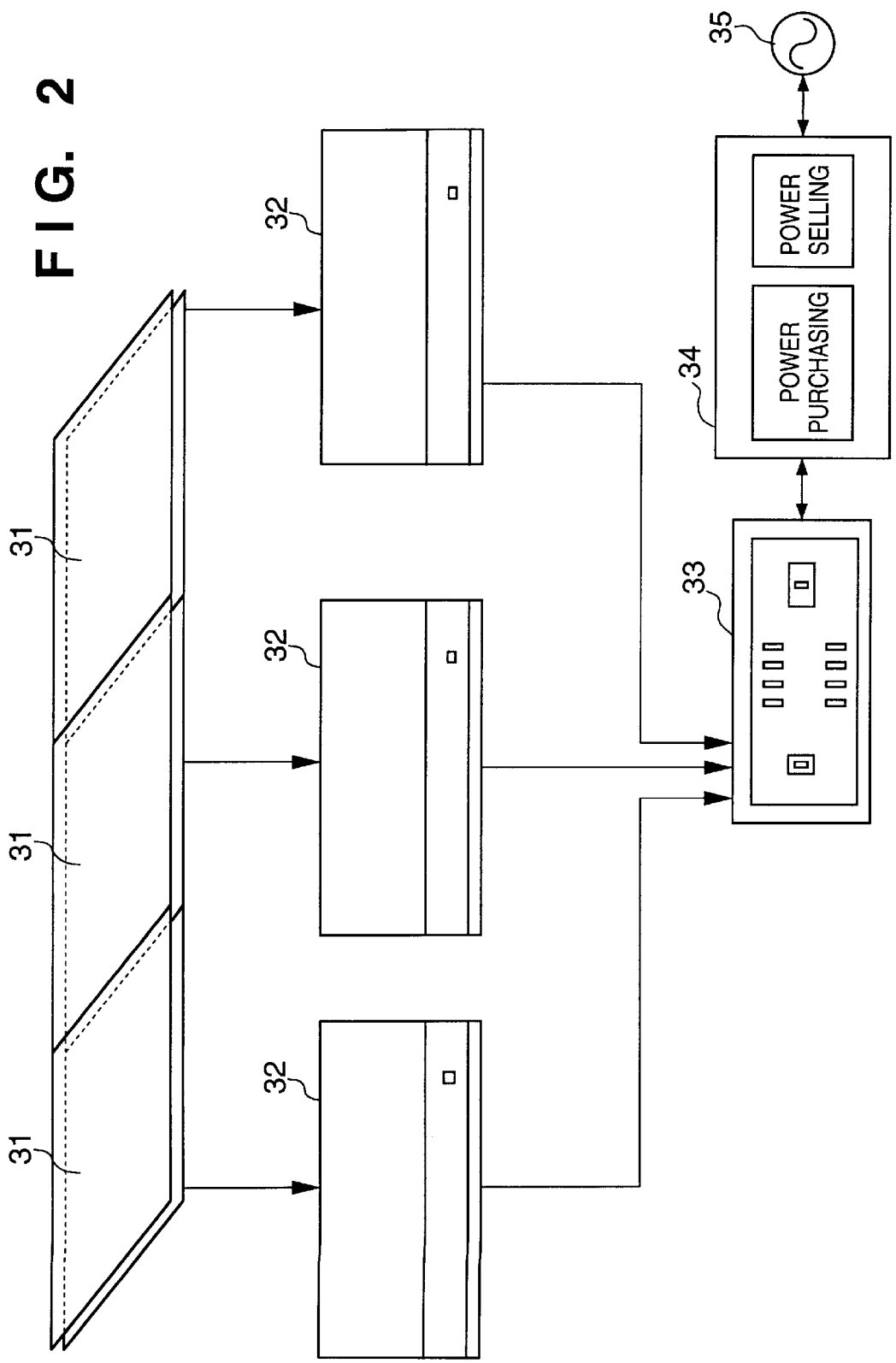
FIG. 2 is a view explaining operation of the photovoltaic power generation apparatus.

FIG. 1 is a typical view of a photovoltaic power generation apparatus according to an embodiment of the present invention. As shown in FIG. 1, the photovoltaic power generation apparatus comprises: three solar battery arrays 11 to 13; and power converters 21 to 23 for converting direct-current(DC) power of each solar battery array to alternating-current(AC) power. The power converters 21 to 23 are set so that operation suspension does not occur at the same time as described above. In a building (user) where the photovoltaic power generation apparatus shown in FIG. 1 is installed, not only electric power is supplied from the commercial power system 5, but electric power can be self-supplied by the photovoltaic power generation apparatus. Furthermore, if a surplus power is generated by the photovoltaic power generation apparatus, the surplus power is sent back to the commercial power system 5.

Solar Battery Arrays 11—13

The solar battery arrays 11 to 13 employed in the present invention are constructed preferably by connecting, in parallel, a plurality of solar battery strings in which plural solar batteries are connected in series. A solar battery using amorphous silicon in a photoelectric transducer or a solar battery using polycrystalline silicon or crystalline silicon is preferably used as the solar battery which constitutes the solar battery arrays 11 to 13. The number of series of the solar batteries, constituting the solar battery strings, may be appropriately set so as to achieve a voltage necessary to serve as a photovoltaic power generation apparatus. In a system of 3 kW output for private houses or a system of 10 kW output for apartment houses, the number of series of the solar batteries is often set so as to achieve about 200V. Note that the solar battery array according to the present invention includes a plurality of solar batteries connected in serie, or a plurality of solar batteries connected in parallel.

Power Converters 21—23

Output of each solar battery array is inputted to the power converters 21 to 23. The power converters 21 to 23 convert DC power from the solar battery arrays to AC power and adjust the AC voltage or current to be outputted. AC power outputted by the power converters 21 to 23 is led to the switchboard 3 through an electrical path.

Switchboard 3

The switchboard 3 is installed in a building (user). From the switchboard 3, interior wiring branches out to supply electric power to lighting equipment in each room of the building or to a general load connected to receptacles or the like. In the switchboard 3, a main breaker is provided to separate the interior wiring from the commercial power system 5. In each interior wiring which branches from the switchboard 3, a branch breaker is provided.

Transaction Power Meter Box 4

The commercial power system 5 is provided inside a building through an electrical path, and a transaction power meter box 4 is provided at some point of the path. Inside the transaction power meter box 4, a purchasing power meter and a selling power meter are connected in series. The purchasing power meter sums up the amount of power supplied from the electrical path to the building, and the selling power meter sums up the amount of power sent back from the photovoltaic power generation apparatus to the commercial power system 5.

First Embodiment

According to the first embodiment of the present invention, the voltage detection value, which is determined as abnormal by the power converters 21 to 23 to FIG. 1, is set in different values. In this way, the overall duration of operation suspension is reduced in a photovoltaic power generation apparatus, and reduction in the amount of power generation can be prevented.

The construction of solar battery arrays 11 to 13 and power distribution of power converters 21 to 23 are described below. One string of solar batteries is constructed by connecting, in series, 14 amorphous solar battery modules (nominal output: 22W; maximum output operating voltage: 14V) to achieve an output voltage of about 200V (output: 308W). Ten strings of solar batteries are connected to power converter 21, and 12 strings of solar batteries are connected respectively to power converters 22 and 23. In this manner, solar battery arrays of about 3.1 kW are connected to power converter 21, and solar battery arrays of about 3.7 kW are connected respectively to power converters 22 and 23, thereby constructing a photovoltaic power generation apparatus capable of 10.5 kW output by the three power converters 21 to 23.

Figures 5A, 5B:
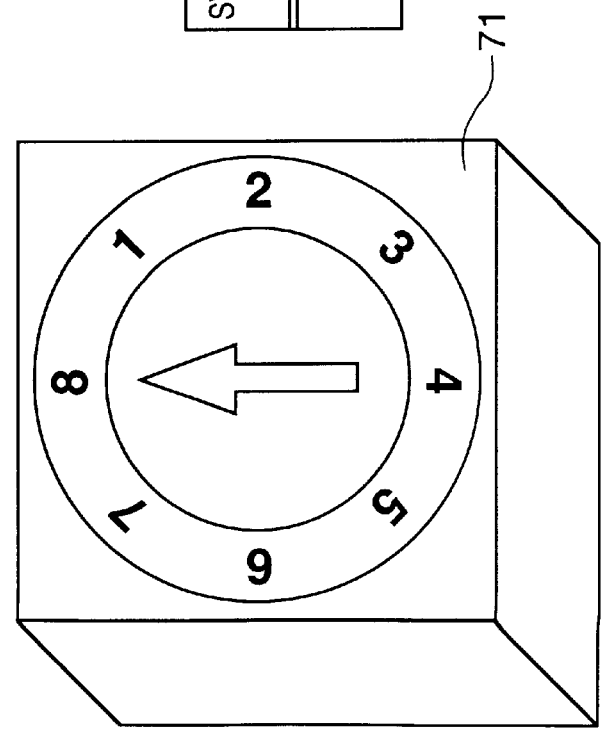
FIG. 5A shows a switch for setting an abnormal voltage.
FIG. 5B is a table showing abnormal voltage values set by the switch shown in FIG. 5A.

Furthermore, each of the power converters 21 to 23 comprises detectors 41 to 43 as shown in FIG. 1 for detecting abnormality of the voltage VR at the power receiving end and a switch 71 such as that shown in FIG. 5A for setting an abnormal voltage. FIG. 5B shows voltage values (hereinafter referred to as "set abnormal voltage value") which are detected as abnormal voltage when the voltage VR at the power receiving end rises. For instance, when the switch 71 is set to the switch setting position "3", an abnormal state is detected when the voltage VR at the power receiving end reaches 110V, and the power converters suspend operation.

Figure 3:
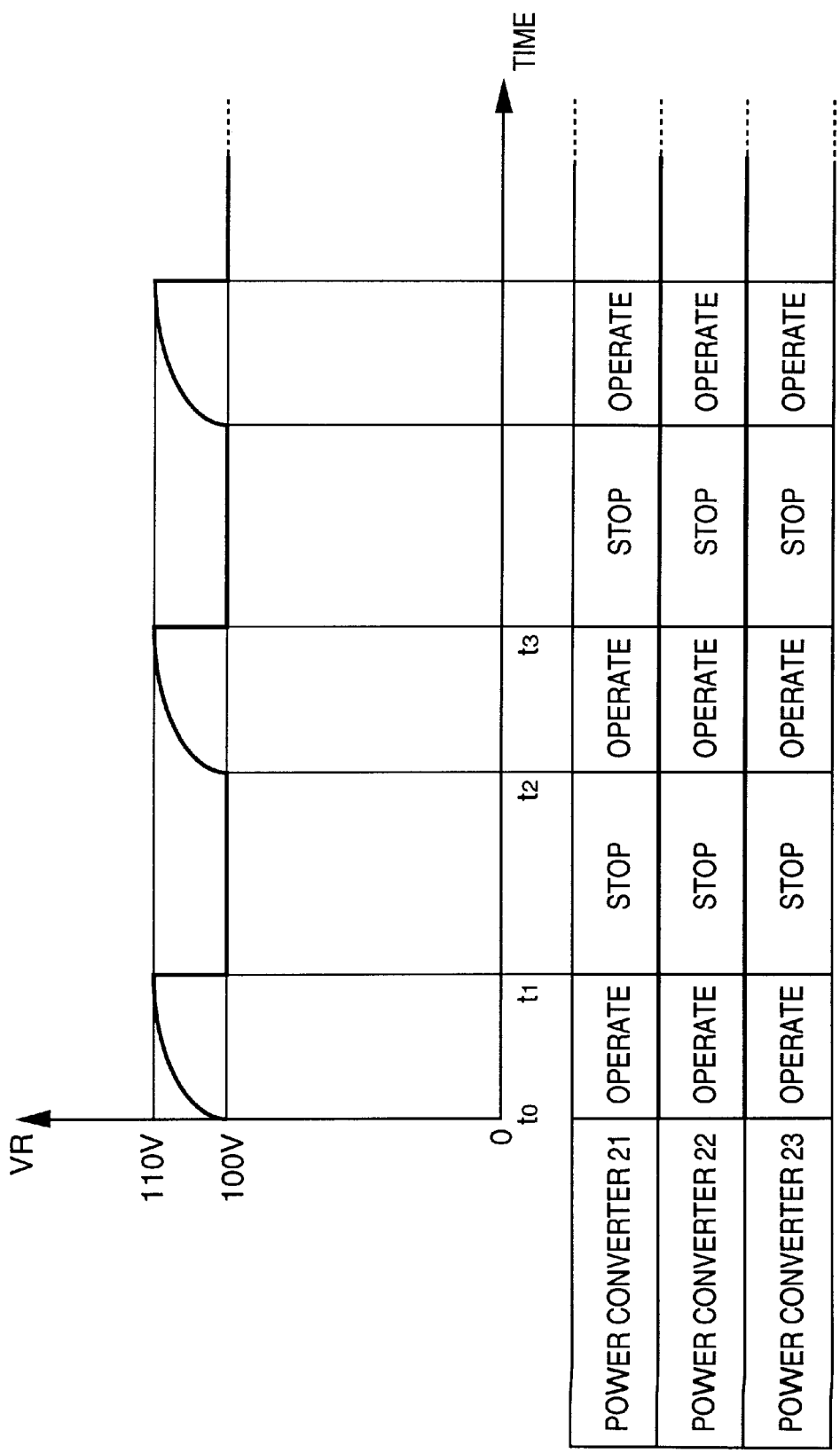
FIG. 3 shows a relation between the voltage at a power receiving end and the operation state of power converters in a case where three power converters have the same set abnormal voltage value.
Figure 4:
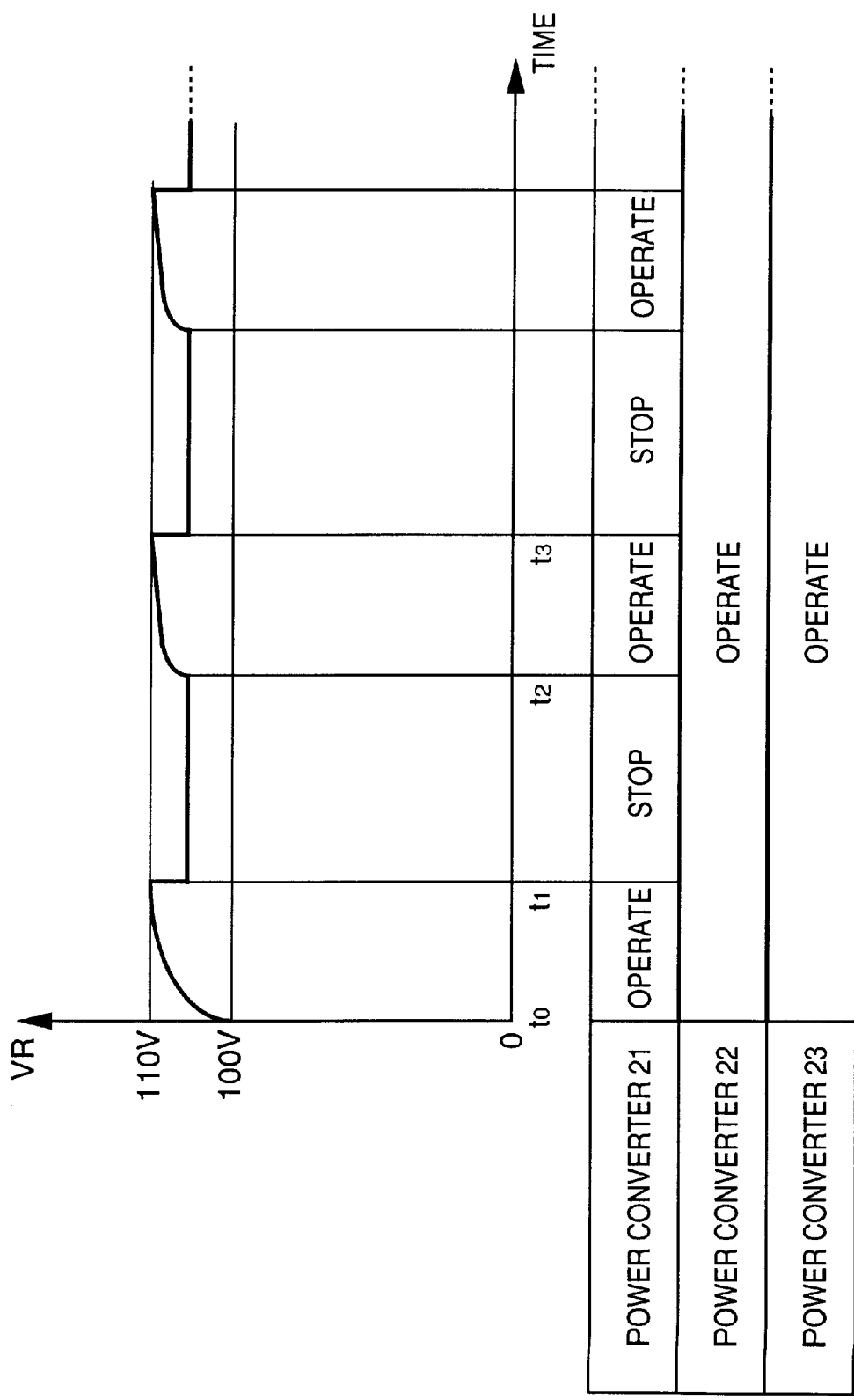
FIG. 4 shows a relation between the voltage at a power receiving end and the operation state of power converters in a case where three power converters have different set abnormal voltage values.

FIG. 3 shows a relation between the voltage VR at the power receiving end of the photovoltaic power generation apparatus and the operation state of power converters 21 to 23. In FIG. 3, the switches 71 for the three power converters 21 to 23 are set in the same value ("3" for 110V). FIG. 4 shows a relation between voltage VR at the power receiving end of the photovoltaic power generation apparatus and the operation state of power converters 21 to 23. In FIG. 4, power converter 21 is set to 110V, power converter 22 is set to 112.5V, and power converter 23 is set to 115V. The graphs in FIGS. 3 and 4 both show the state in which the system voltage VS rises at timing t0 due to an irregular circumstance of a power generating station or power transmission station, and along with the rise of VS, the voltage VR at the power receiving end also rises.

According to FIG. 3, the voltage VR at the power receiving end is 100V at timing t0. As the system voltage VS rises, the voltage VR exceeds the set abnormal voltage value 110V at timing t1, and power converters 21 to 23 suspend operation. When power converters 21 to 23 suspend operation, voltage drop caused by a backward current flow no longer occurs. In addition, voltage falls in correspondence with the amount of power consumed by the user. Therefore, the voltage VR at the power receiving end falls. FIG. 3 shows that the voltage drops by about 10V. As a result of operation suspension of power converters 21 to 23, the voltage VR at the power receiving end falls below the set abnormal voltage value, and when this state continues for a predetermined duration, the three power converters 21 to 23 resume their operation. When power converters 21 to 23 resume their operation at timing t2, the voltage VR at the power receiving end rises again. Then, when the voltage VR at the power receiving end reaches the set abnormal voltage value 110V at timing t3, all three power converters 21 to 23 again suspend operation. Such repetition of operation suspension and operation resume continues until the end of the aforementioned state, i.e., in which the system voltage VS rises due to an irregular circumstance of a power generating station or power transmission station. Note that FIGS. 3 and 4 show an example where the voltage VR at the power receiving end rises in a logarithmic curve. This is because the photovoltaic power generation apparatus is controlled by Maximum Power Point Tracking (MPPT) and because the backward current power rises in a logarithmic curve.

However, in FIG. 4, since the set abnormal voltage values are different for each of the power converters 21 to 23, only power converter 21 suspends operation at timing t1 when the voltage VR at the power receiving end reaches 110V. In correspondence with the operation suspension of the power converter 21, the backward current power falls, and voltage VR at the power receiving end falls. As a result, power converters 22 and 23 can continue operating without operation suspension. Similar to FIG. 3, power converter 21 repeats operation suspension and operation resume until the system voltage VS stops rising.

As is apparent from the comparison of FIG. 3 to FIG. 4, having different set abnormal voltage values for power converters 21 to 23 can reduce the overall duration of operation suspension of power converters 21 to 23 and can suppress reduction in the power generation amount of the photovoltaic power generation apparatus caused by a rise of the system voltage VS. In addition, variation of the voltage VR at the power receiving end can be reduced.

Note that according to the above description, the power converter suspends operation when the voltage VR at the power receiving end reaches the set abnormal voltage value, and then resumes the operation when the voltage VR at the power receiving end stays below the set abnormal voltage value for a predetermined time period. However, it is also possible to set the operation resume voltage lower than the operation suspend voltage so as to reduce the repetition of operation suspension and operation resume of the power converters. More specifically, assuming the set abnormal voltage value is 110V, the operation resume voltage for VR may be set to 108V. In this case, the operation of the power converter resumes when the voltage VR at the power receiving end is equal to or lower than 108V for a predetermined duration.

Furthermore, power converter 21 is set in the first-to-suspend condition because, as mentioned above, power converter 21 among power converters 21 to 23 is connected to the solar battery array 11 having the smallest power generation amount (3.1 kW). By setting a power converter having the smallest power generation amount in the first-to-suspend condition, it is possible to minimize the reduction of the overall power generation amount of the photovoltaic power generation apparatus caused by a rise of the system voltage VS. In addition, variation of the voltage VR at the power receiving end can be minimized.

Second Embodiment

The first embodiment has described a method of setting different abnormal voltage values for the plurality of power converters, thereby reducing the overall duration of operation suspension of a plurality of power converters and preventing the power generation amount from decreasing. The second embodiment reduces the overall duration of operation suspension of a plurality of power converters and prevents the power generation amount from falling by setting different abnormal voltage detection time for the plurality of power converters.

Since the construction of the photovoltaic power generation apparatus according to the second embodiment is the same as that of the first embodiment, except for the setting switch function of power converters 21 to 23, detailed description thereof will be omitted.

Figures 6A, 6B:
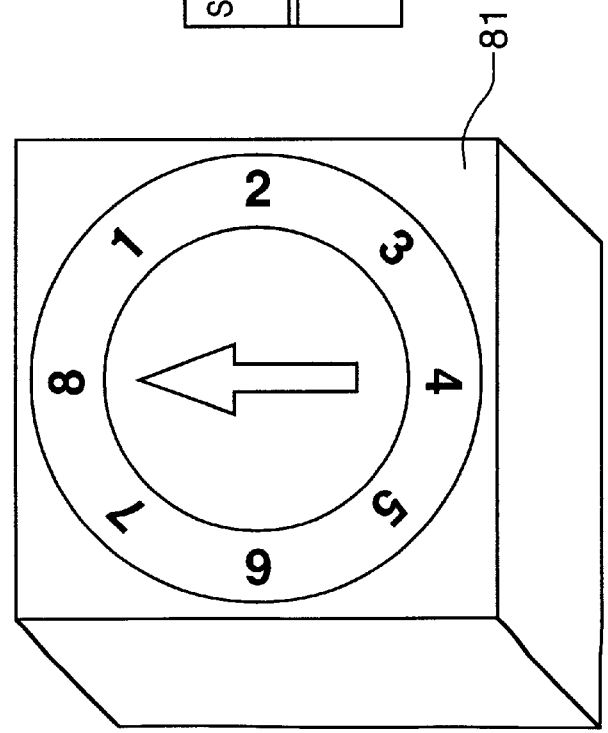
FIG. 6A shows a switch for setting abnormal voltage detection time according to the second embodiment of the present invention.
FIG. 6B is a table showing detection time set by the switch shown in FIG. 6A.

Each of the power converters 21 to 23 comprises a switch 81, such as that shown in FIG. 6A for setting abnormal voltage detection time. FIG. 6B shows set values for the abnormal voltage detection time (hereinafter referred to as "set detection time value"). For instance, when the switch 81 is set to the switch setting position "3", an abnormal state is detected when the abnormal voltage detection time reaches 1.0 second, and the power converters suspend operation.

Figure 7:
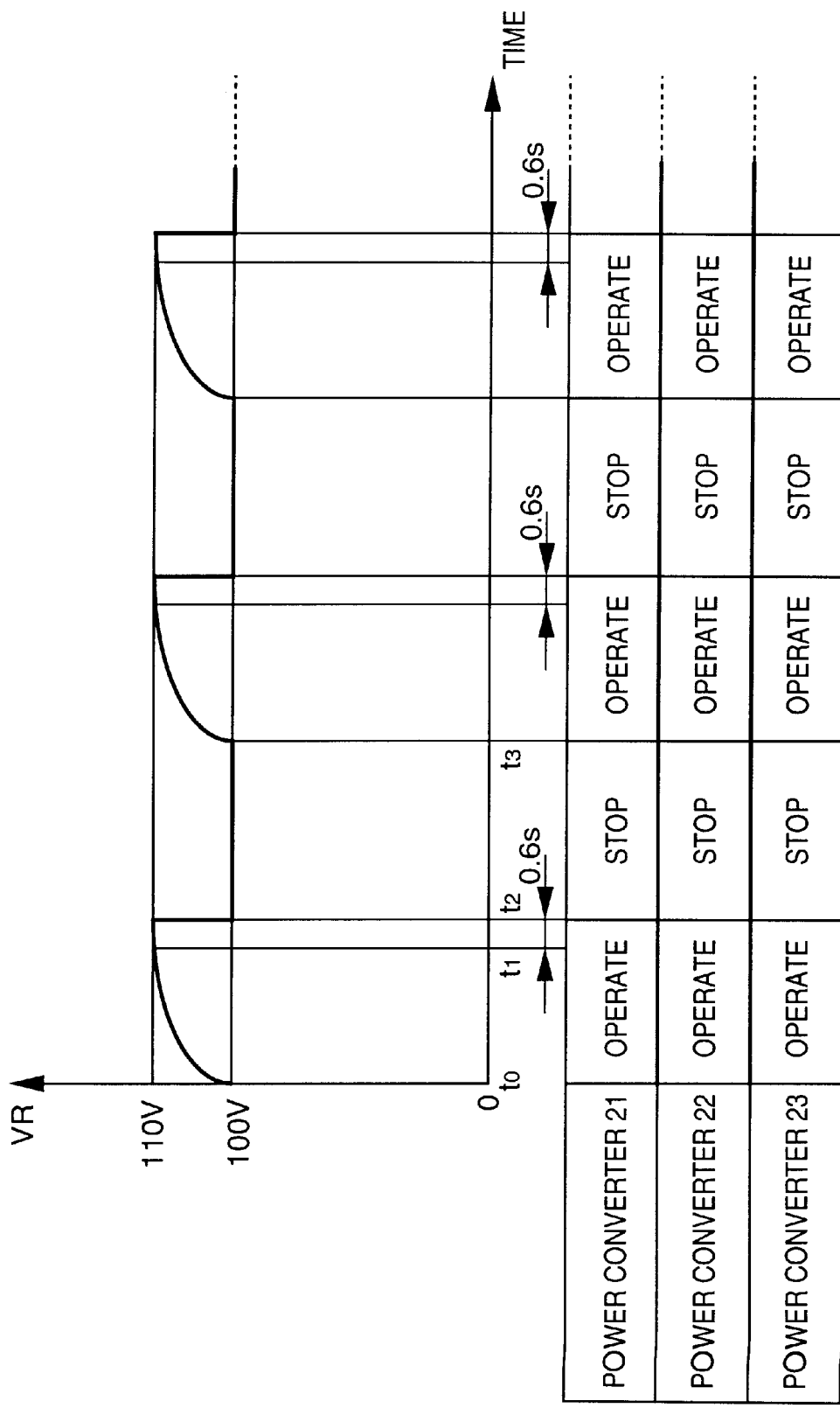
FIG. 7 shows a relation between the voltage at a power receiving end and the operation state of power converters in a case where three converters are set in the same set abnormal voltage detection time.
Figure 8:
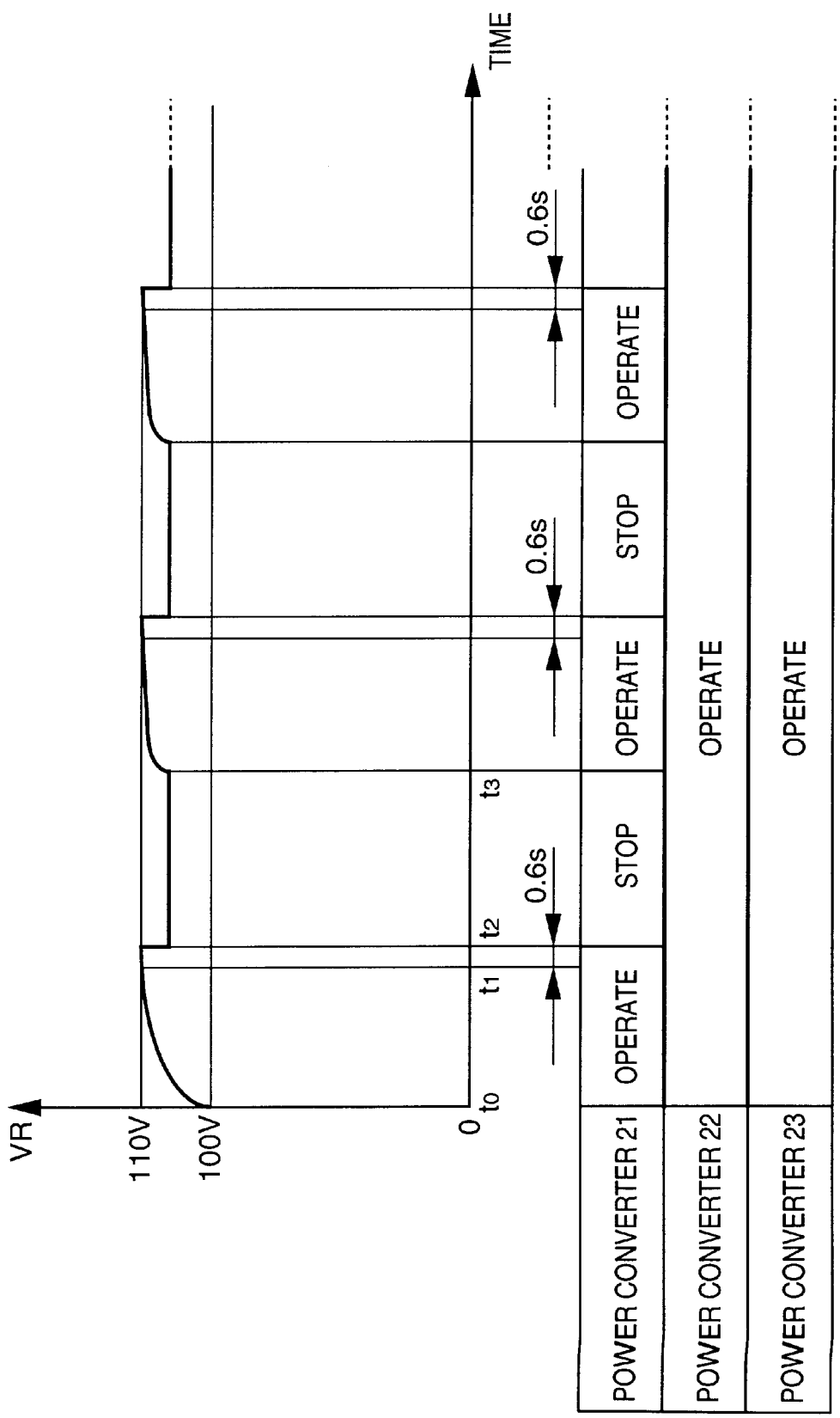
FIG. 8 shows a relation between the voltage at a power receiving end and the operation state of power converters in a case where three converters are set in different set abnormal voltage detection time.
Figure 9A:
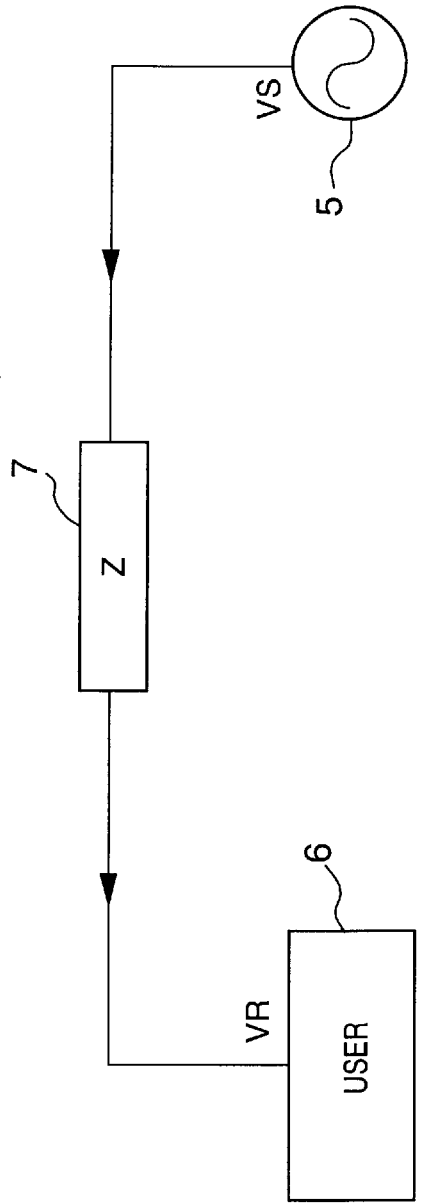
FIGS. 9A and 9B are views explaining a voltage change at a power receiving end of the photovoltaic power generation apparatus at the time of power reception or backward current flow.
Figure 9B:
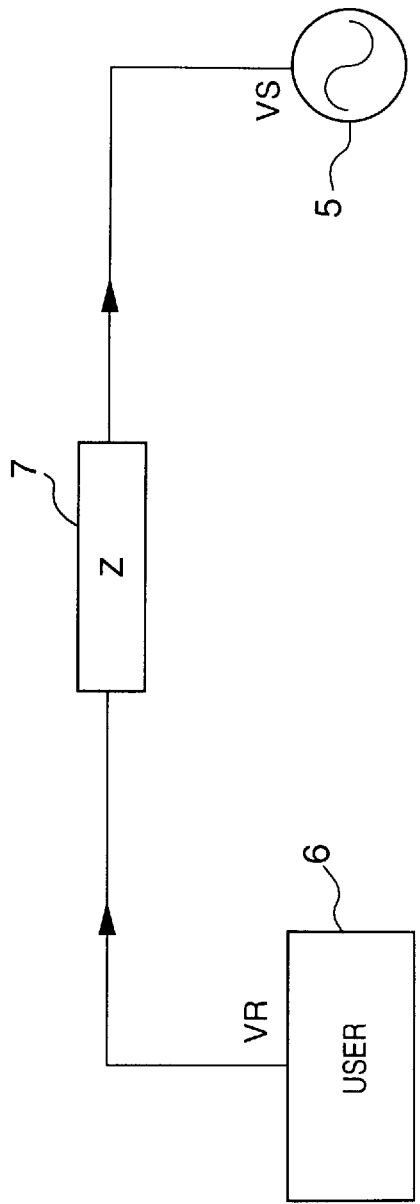
Figure 10:
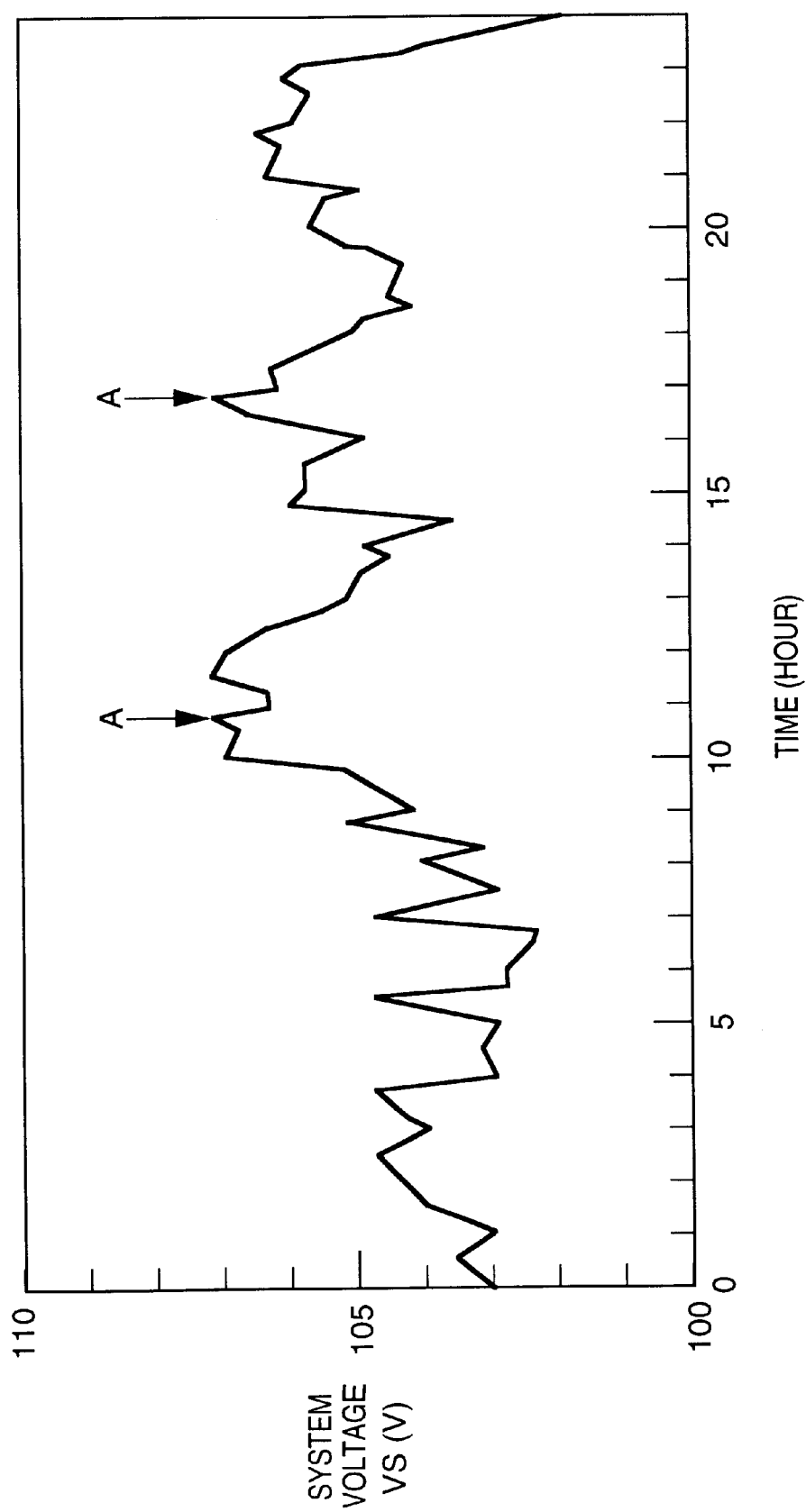
FIG. 10 is a graph showing a measurement result of daily voltage variation in a commercial power system.

FIG. 7 shows a relation between the voltage VR at the power receiving end of the photovoltaic power generation apparatus and the operation state of power converters 21 to 23. In FIG. 7, the switches 81 for the three converters 21 to 23 all have the same switch setting position (e.g., "1" for 0.6 seconds). FIG. 8 shows a relation between voltage VR at the power receiving end of the photovoltaic power generation apparatus and the operation state of power converters 21 to 23. In FIG. 8, power converter 21 is set to 0.6 second, power converter 22 is set to 1.0 second, and power converter 23 is set to 1.4 seconds. The graphs in FIGS. 7 and 8 both show the state in which the system voltage VS rises at timing t0 due to an irregular circumstance of a power generating station or power transmission station, and along with the rise of VS, the voltage VR at the power receiving end also rises.

When the voltage VR at the power receiving end reaches or exceeds the set abnormal voltage value 110V at timing t1 and if such state continues for 0.6 second (set detection time), power converters 21 to 23 suspend operation. Therefore, if the set detection time value is the same for all the power converters 21 to 23, power converters 21 to 23 simultaneously suspend operation at timing t2 as shown in FIG. 7. Then, if the voltage VR at the power receiving end stays below the set abnormal voltage value 110V for a predetermined duration, power converters 21 to 23 simultaneously resume their operation at timing t3. Such repetition of operation suspension and operation resume continues until the end of the aforementioned state, i.e., in which the system voltage VS rises due to an irregular circumstance of a power generating station or power transmission station.

However, in FIG. 8, the set detection time values are different for each of the power converters 21 to 23. When the voltage VR at the power receiving end reaches the set abnormal voltage value 110V at timing t1 and as this state continues for 0.6 second, power converter 21 suspends operation at timing t2. In correspondence with the operation suspension of power converter 21, the backward current power falls, and the voltage VR at the power receiving end falls. As a result, power converters 22 and 23 can continue operating without operation suspension.

As is apparent from the comparison of FIG. 7 to FIG. 8, having different set detection time values for power converters 21 to 23 can reduce the overall duration of operation suspension of power converters 21 to 23 and can suppress reduction in the power generation amount of the photovoltaic power generation apparatus caused by a rise of the system voltage VS. In addition, variation of the voltage VR at the power receiving end can be reduced.

Note that power converter 21 is set in the first-to-suspend condition for the same reason as in the first embodiment. In this way, it is possible to minimize the reduction of the overall power generation amount of the photovoltaic power generation apparatus caused by a rise of the system voltage VS and minimize variation of the voltage VR at the power receiving end.

Third Embodiment

The third embodiment is a combination of the method according to the first embodiment in which different abnormal voltage values are set and the method according to the second embodiment in which different detection time values are set. More specifically, according to the third embodiment which employs the apparatus and construction similar to that of the first and second embodiments shown in FIG. 1, different set abnormal voltage values and different set detection time values are set for each of the power converters 21 to 23 so as to further differentiate the condition for operation suspension.

Each of the power converters 21 to 23, employed in the third embodiment, comprises the switch 71 such as that shown in FIG. 5A for setting abnormal voltage and the switch 81 such as that shown in FIG. 6A for setting abnormal voltage detection time. The set abnormal voltage and detection time for power converter 21 are respectively set to 110V and 0.6 second; for power converter 22, 112.5V and 1.0 second; and for power converter 23, 115V and 1.4 seconds.

In this manner, the power converters are so set to have a larger set abnormal voltage value for a larger set detection time value, so that the condition for operation suspension is further differentiated for each of the power converters 21 to 23.

According to the third embodiment, it is possible to further minimize the reduction of the overall power generation amount of the photovoltaic power generation apparatus and further minimize variation of the voltage VR at the power receiving end, compared to the first and second embodiments.

Furthermore, power converter 21 is set in the first-to-suspend condition for the same reason as in the first and second embodiments.

Contrary to the foregoing setting, the power converters may be so set to have a smaller set detection time value for a larger set abnormal voltage value. In this case, when abnormal voltage is detected, operation of the power converter can be suspended within a shorter time period than in the above-described setting. This is preferable for the purpose of protecting the power converters.

Although each of the foregoing embodiments describes a case where an abnormal voltage is detected as a result of the rise of the system voltage VS, the present invention is also applicable to a case where the detectors 41 to 43 detect abnormal frequency of the commercial power system by setting abnormal frequency or detection time. In this case also, a power converter generating the smallest amount of power is set in the first-to-suspend condition. In this way, it is possible to minimize the reduction of the overall power generation amount of the photovoltaic power generation apparatus caused by an abnormal frequency of the commercial power system and minimize variation of the voltage VR at the power receiving end.

The present invention is not limited to the above embodiments, and various changes and modifications can be made within the spirit and scope of the present invention.

According to each of the above-described embodiments, the present invention has the following effects.

(1) Even when a system voltage VS is high, repetition of operation suspension and operation resume of a power converter can be reduced, an operating duration of a photovoltaic power generation apparatus can be maximized, and the reduction of the power generation amount can be suppressed. Also generation of an electrical stress, caused by the repetition of operation suspension and operation resume of the power converter, can be prevented.

(2) Variation of the voltage VR at the power receiving end of the photovoltaic power generation apparatus, caused by a rise of the system voltage VS, can be reduced.

To apprise the public of the scope of the present invention, the following claims are made.

What is claimed is:

1. A photovoltaic power generation apparatus comprising:
plural solar battery arrays, each of which is constructed by plural solar battery modules; and
plural power converters, each of which is connected to one of said plural solar battery arrays, for converting direct-current power generated by said plural solar battery arrays to alternating-current power so as to provide the alternating-current power to a commercial power system,
wherein each of said plural power converters comprises a detector for detecting an abnormal state of output of the alternating-current power of said each of the plural power converters to suspend power conversion operation of said each of the plural power converters, and
operation suspension timing of at least one of said plural power converters is earlier than the others.

2. The apparatus according to claim 1, the operation suspension timing of one of said plural power converters is different from the others.

3. The apparatus according to claim 1, wherein each of said plural solar battery arrays is constructed with plural strings connected in parallel, and each of the plural strings is constructed with the plural solar battery modules connected in series.

4. The apparatus according to claim 1, wherein a value for detecting the abnormal state, set for said detector of at least one of said plural power converters, is different from values set for detectors of the other converters.

5. The apparatus according to claim 1, wherein a period between the time of abnormal state detection and the time of operation suspension is set differently for at least one of said plural power converters.

6. The apparatus according to claim 1, wherein one of said plural power converters, which is connected to one of said plural solar battery arrays that generates less power than other plural solar battery arrays, is set so as to suspend operation earlier than the other converters.

7. The apparatus according to claim 1, wherein said detector measures a voltage of the output of the alternating-current power, and determines the abnormal state when the measured voltage reaches or exceeds a set value because of a rise of a voltage of the commercial power system.

8. The apparatus according to claim 7, wherein the set value, set for a detector of at least one of said plural power converters, is different from set values for detectors of the other converters.

9. The apparatus according to claim 7, wherein a period between the time of abnormal state detection and the time of operation suspension is set differently for at least one of said plural power converters.

10. The apparatus according to claim 7, wherein one of said plural power converters, which is connected to one of said plural solar battery arrays that generates less power than other plural solar battery arrays, is set so as to suspend operation earlier than the other converters.

11. A controlling method of a photovoltaic power generation apparatus having: plural solar battery arrays, each of which is constructed by plural solar battery modules; and plural power converters, each of which is connected to one of said plural solar battery arrays, for converting direct-current power generated by said plural solar battery arrays to alternating-current power so as to provide the alternating-current power to a commercial power system, said method comprising the steps of:
detecting an abnormal state of output of the alternating-current power of each of the plural power converters; and
suspending power conversion operation of each of the plural power converters when the abnormal state is detected,
wherein operation suspension timing of at least one of said plural power converters is earlier than the others.

12. The method according to claim 11, wherein said detecting step comprises the steps of:
measuring a voltage of the output of the alternating-current power; and
detecting the abnormal state based on the measured voltage,
wherein said detecting step detects the abnormal state when the measured voltage reaches or exceeds a set value because of a rise of a voltage of the commercial power system.

* * * * *

UNITED STATES PATENT AND TRADEMARK OFFICE
CERTIFICATE OF CORRECTION

PATENT NO. : 6,169,678 B1
DATED : January 2, 2001
INVENTOR(S) : Hiroshi Kondo, et al.

Page 1 of 1

It is certified that error appears in the above-identified patent and that said Letters Patent is hereby corrected as shown below:

<u>Title page,</u>
Item [30], FOREIGN APPLICATION PRIORITY DATA, "12-011857" should read -- 2000 - 011857 --.

<u>Column 1,</u>
Line 27, "is" should read -- are --.

<u>Column 2,</u>
Line 44, "lines" should read -- lines, --;
Line 45, "where" should be deleted; and
Line 66, "objet" should read -- object --.

<u>Column 5,</u>
Line 24, "serie," should read -- series --.

<u>Column 10,</u>
Line 1, "claim 1," should read -- claim 1, wherein --.

Signed and Sealed this

Twenty-seventh Day of November, 2001

Attest:

*Nicholas P. Godici*

NICHOLAS P. GODICI
*Attesting Officer*      *Acting Director of the United States Patent and Trademark Office*